United States Patent
Ramaswamy et al.

(10) Patent No.: US 9,412,563 B2
(45) Date of Patent: Aug. 9, 2016

(54) SPATIALLY DISCRETE MULTI-LOOP RF-DRIVEN PLASMA SOURCE HAVING PLURAL INDEPENDENT ZONES

(71) Applicant: APPLIED MATERIALS, INC., Santa Clara, CA (US)

(72) Inventors: Kartik Ramaswamy, San Jose, CA (US); Kenneth S. Collins, San Jose, CA (US); Shahid Rauf, Pleasanton, CA (US); Steven Lane, Porterville, CA (US); Yang Yang, Sunnyvale, CA (US); Lawrence Wong, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 512 days.

(21) Appl. No.: 14/026,227

(22) Filed: Sep. 13, 2013

(65) Prior Publication Data

US 2015/0075716 A1  Mar. 19, 2015

(51) Int. Cl.
*H01L 21/306* (2006.01)
*C23C 16/00* (2006.01)
*H01J 37/32* (2006.01)
*H05H 1/46* (2006.01)

(52) U.S. Cl.
CPC ......... *H01J 37/32183* (2013.01); *H01J 37/321* (2013.01); *H01J 37/32458* (2013.01); *H05H 1/46* (2013.01); *H05H 2001/4652* (2013.01)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32357
USPC ........ 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 2007/0087455 A1* | 4/2007 | Hoffman | ........... | H01J 37/32082 438/5 |
| 2009/0025878 A1* | 1/2009 | Rauf | ........ | H01J 37/16 156/345.48 |
| 2014/0020837 A1* | 1/2014 | Nguyen | .......... | C23F 1/08 156/345.48 |

* cited by examiner

*Primary Examiner* — Luz Alejandro Mulero
(74) *Attorney, Agent, or Firm* — Robert M. Wallace (57) ABSTRACT

An RF plasma source has a resonator with its shorted end joined to the processing chamber ceiling and inductively coupled to two arrays of radial toroidal channels in the ceiling, the resonator having two radial zones and the two arrays of toroidal channels lying in respective ones of the radial zones.

20 Claims, 12 Drawing Sheets

SPATIALLY DISCRETE MULTI-LOOP RF-DRIVEN PLASMA SOURCE HAVING PLURAL INDEPENDENT ZONES

BACKGROUND

1. Technical Field

The disclosure relates to RF-driven plasma sources for reactors employed in plasma processing of workpieces such as semiconductor wafers.

2. Background Discussion

In plasma processing of workpiece, such as a semiconductor wafer, there is a need for a plasma source capable of providing a high plasma ion density and, simultaneously, a low plasma sheath ion energy to an extent that is currently unavailable. A high plasma ion density is needed for improved processing rate and productivity. A reduced plasma ion energy is needed for reduced plasma ion energy in order to prevent contamination from ion bombardment of metal surfaces near the plasma sheath. Reduced ion energy may also reduce ion bombardment damage to semiconductor device features. Such features are becoming extremely small and more susceptible to such damage, thus requiring reduction in plasma electron energy.

A basic problem is that plasma sources capable of providing high density plasma also produce relatively high energy plasma ions. The reason is that such sources couple relatively high electric fields to the plasma, raising the plasma sheath voltage. High plasma sheath voltages impart high energy to plasma ions in the plasma sheath. This produces ion bombardment of metal surfaces adjacent the plasma sheath, which produces metal contamination. An inductively coupled plasma source employs an RF-driven coil antenna, which has a capacitance that couples a high voltage to the plasma, contributing to the high plasma sheath voltage. A capacitively coupled plasma source employs an RF-driven electrode which has an even greater tendency to couple high voltage to the plasma. Toroidal plasma sources produce plasma densities somewhat less than inductively coupled plasma sources.

What is needed is a plasma source capable of producing a plasma having an ion density as great as or exceeding that of a conventional inductively coupled plasma source, and with a minimum plasma ion energy less than (or not exceeding) that of conventional plasma sources.

SUMMARY

A plasma reactor comprises a processing chamber including a ceiling, and a resonator having an axis of symmetry transverse to the ceiling, the resonator comprising: (a) inner and outer return cylinders and an intermediate return cylinder between the inner and outer return cylinders, (b) inner and outer RF-driven cylinders adjacent inner and outer surfaces, respectively, of the intermediate return cylinder, (c) the inner and outer return cylinders and the inner and outer RF-driven cylinders contacting the ceiling.

The reactor further comprises first and second RF power generators coupled to respective ones of the inner and outer RF-driven cylinders, and inner and outer pluralities of reentrant conduits on a side of the ceiling external of the processing chamber, the inner and outer pluralities of reentrant conduits disposed, respectively, in inner and outer concentric zones of the ceiling.

In an embodiment, each of the plural reentrant conduits extends in a radial direction. The plasma reactor may further comprise a plasma distribution controller adapted to govern a ratio between power output levels of the first and second RF power generators.

In one embodiment, the ceiling comprises, for each respective reentrant conduit of the inner and outer pluralities of reentrant conduits, a pair of ports extending through the ceiling and coupled to opposite ends of the respective reentrant conduit.

In an embodiment, the ceiling comprises an internal gas manifold and gas injection orifices coupled to the gas manifold, while the plasma reactor further comprises a process gas supply and a gas supply conduit coupled to the internal manifold and extending axially from the internal manifold and through an interior volume of the hollow center ground cylinder to the process gas supply. In a related embodiment, the gas injection orifices comprise openings facing an interior of the processing chamber.

In one embodiment, the plasma reactor further comprises a coolant supply, internal recirculation passages in the ceiling and a coolant supply conduit coupled to the internal recirculation passages and extending axially from the ceiling and through an interior volume of the hollow center ground cylinder to the coolant supply.

In an embodiment, each of the plural reentrant conduits comprises a conductive main portion and an insulating ring-shaped break.

In one embodiment, each of the ports has a width along a direction transverse to the path that exceeds a diameter of the respective one of the plural reentrant conduits. In a related embodiment, each of the reentrant ports has a cross-sectional shape that is one of: circular, oval, rectangular, kidney-shaped.

In one embodiment, the resonator has an axial length corresponding to a half wavelength of RF current or RF voltage produced by the RF power generator.

A related embodiment further includes a cap covering and contacting top edges of the inner, outer and intermediate return cylinders. Further, the inner and outer RF-driven cylinders are terminated at respective heights below the cap defining respective gaps between the inner and outer RF-driven cylinders and the cap. In a related embodiment, the intermediate return cylinder is terminated at a height above the ceiling defining a separation between the intermediate return cylinder and the ceiling.

Optionally, there may be provided an RF bias power generator having an output terminal coupled to the workpiece support and a return terminal coupled to the ceiling.

In an embodiment, a first plurality of legs are connected between the first RF power generator and respective first points on the inner RF-driven cylinder, and a second plurality of legs are connected between the second RF power generator and respective second points on the outer RF-driven cylinder.

In a related embodiment, the respective first points are located on a top edge of the inner RF-driven cylinder and the respective second points are located on a top edge of the outer RF-driven cylinder.

In a further embodiment, there is provided a first shield enveloping a portion of each of the first plurality of legs and a second shield enveloping a portion of each of the second plurality of legs.

In one embodiment, the ceiling contacts respective bottom edges of the inner and outer return cylinders and respective bottom edges of the inner and outer RF-driven cylinders.

In one embodiment, the inner and outer concentric zones of the ceiling are divided at a circular border corresponding to the intermediate return cylinder.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention meet the need for an extremely high ion density plasma source with an extremely low plasma ion energy, by employing an RF-driven coaxial resonator whose shorted end is adjacent a plasma chamber wall (e.g., the ceiling) and whose open end is away from the plasma. A circular array of reentrant toroidal conduits is provided on the ceiling. Process gas in the chamber fills each of the toroidal conduits, and is ionized by RF power to produce a plasma as follows: Each toroidal conduit has a radial path direction, each of which is orthogonal to an azimuthal (circumferential) RF magnetic field produced at the shorted end of the coaxial resonator. This azimuthal RF magnetic field produces a radial RF electric field that is parallel to the path of each toroidal conduit. This azimuthal RF magnetic field is maximum at the coaxial resonator shorted end where the toroidal conduits are located, for maximum coupling to RF currents in the array of toroidal conduits, producing maximum plasma ion density. Furthermore, the electric field is minimum at the coaxial resonator shorted end, for coupling of minimum voltage to the bulk plasma, to minimize electric field in the bulk plasma. Minimizing the electric field in the bulk plasma reduces plasma electron temperature. Minimizing electric field in the bulk plasma also increases plasma ion density. Minimizing (or reducing) the plasma electron temperature and increasing the plasma ion density minimizes (reduces) the plasma sheath voltage. This reduces the energy of ions bombarding metal surfaces near the plasma sheath, which reduces metal contamination caused by sputtering of the metal surfaces. The reactor is characterized by very low metal contamination.

Each of the reentrant toroidal conduits is "external" in that each one is on the side of the chamber wall or ceiling that is opposite (outside of) the plasma chamber. The reentrant toroidal conduits are arranged in a circle, each conduit lying along a radial direction with respect to the coaxial resonator. The current path direction in each toroidal conduit is orthogonal to the azimuthal RF magnetic field at the coaxial resonator shorted end. The azimuthal RF magnetic field produces a radial RF electric field. The reentrant toroidal conduits, lying in the radial direction, are parallel with the radial RF electric field, which maximizes coupling to RF currents in the toroidal conduits.

The coaxial resonator has an inner RF-driven conductive cylinder and an outer hollow return cylinder surrounding the inner RF-driven conductive cylinder and coupled to an RF return potential (e.g., ground). The inner and outer conductive cylinders are electrically shorted together by the chamber ceiling, so that the shorted end of the coaxial resonator is adjacent the plasma. An RF generator is coupled to the inner RF driven element. The electrical length of the coaxial resonator is related to the wavelength of the RF generator, and is typically one wavelength, a half wavelength or a quarter wavelength. In one embodiment, the space above the chamber ceiling occupied by the coaxial resonator may be reduced by folding the resonator while preserving its electrical length.

Referring to FIGS. 1A, 1B, 1C and 1D, a processing chamber 100 is enclosed by a cylindrical side wall 102, a floor 104 and a cover plate 106 that serves as a ceiling of the processing chamber 100. A vacuum pump 108 evacuates the chamber 100. A workpiece support pedestal 110 within the processing chamber 100 includes a workpiece support surface 112 for holding a workpiece 114 in facing relationship with the cover plate 106. A gas injection plate 116 on the bottom surface of the cover plate 106 includes an internal gas manifold 118 having an array of gas injection orifices 120 facing the workpiece support surface 112. A gas supply conduit 122 coupled to the internal gas manifold 118 extends upwardly from the gas injection plate 116. A pair of coolant supply conduits 124 extend to internal coolant circulation passages 126 within the cover plate 106. The cover plate 106 and the gas injection plate 116 may be formed separately or as a single piece, and either one or both may serve as the ceiling of the processing chamber 100. Optionally, an RF bias power generator 127 is coupled through an impedance match 128 to an electrode 129 underlying the workpiece support surface 112. The cover plate 106 may be connected to the return potential of the RF power generator 127.

Figure 1A:
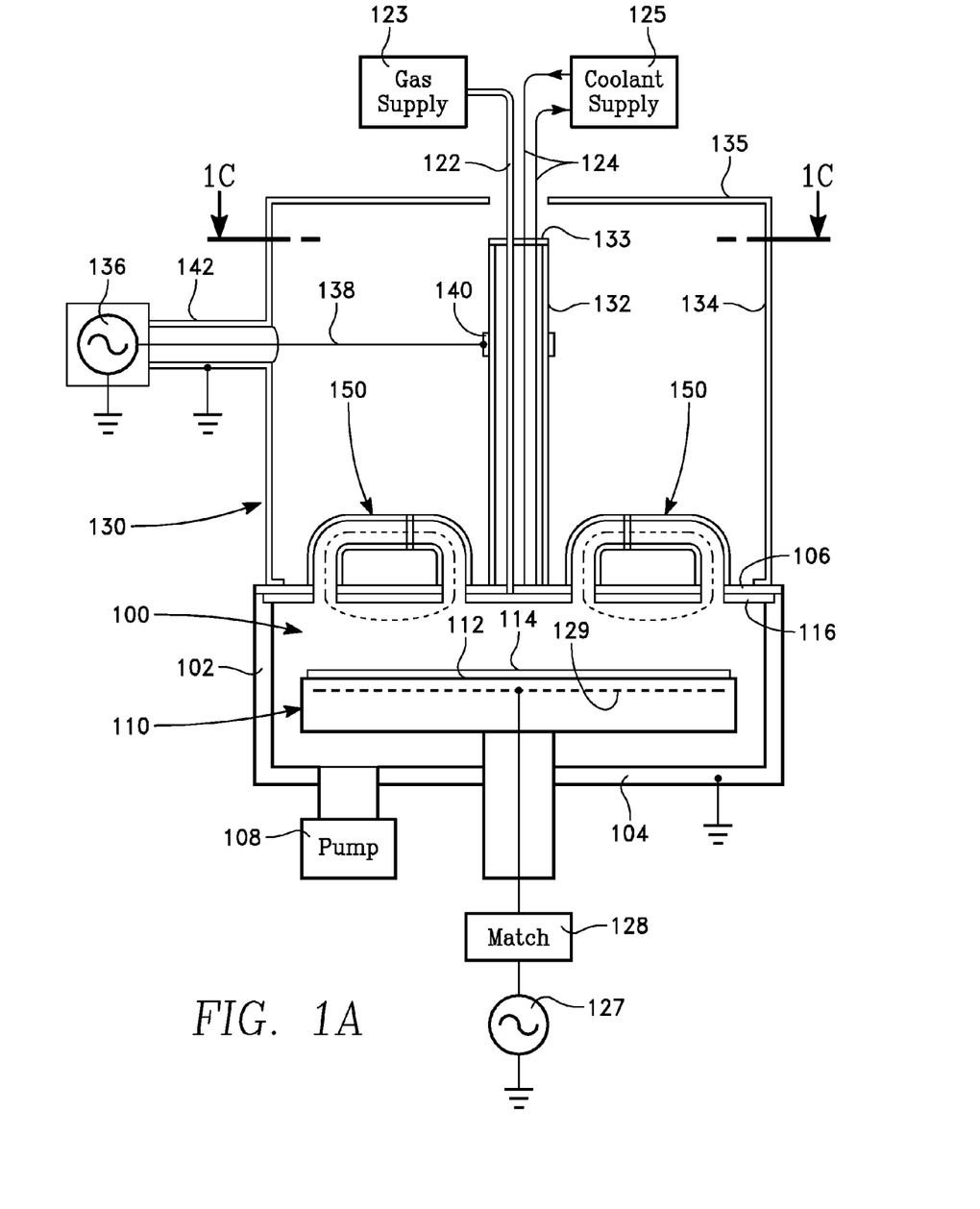
FIG. 1A is an elevational cut-away view of a first embodiment.
Figure 1B:
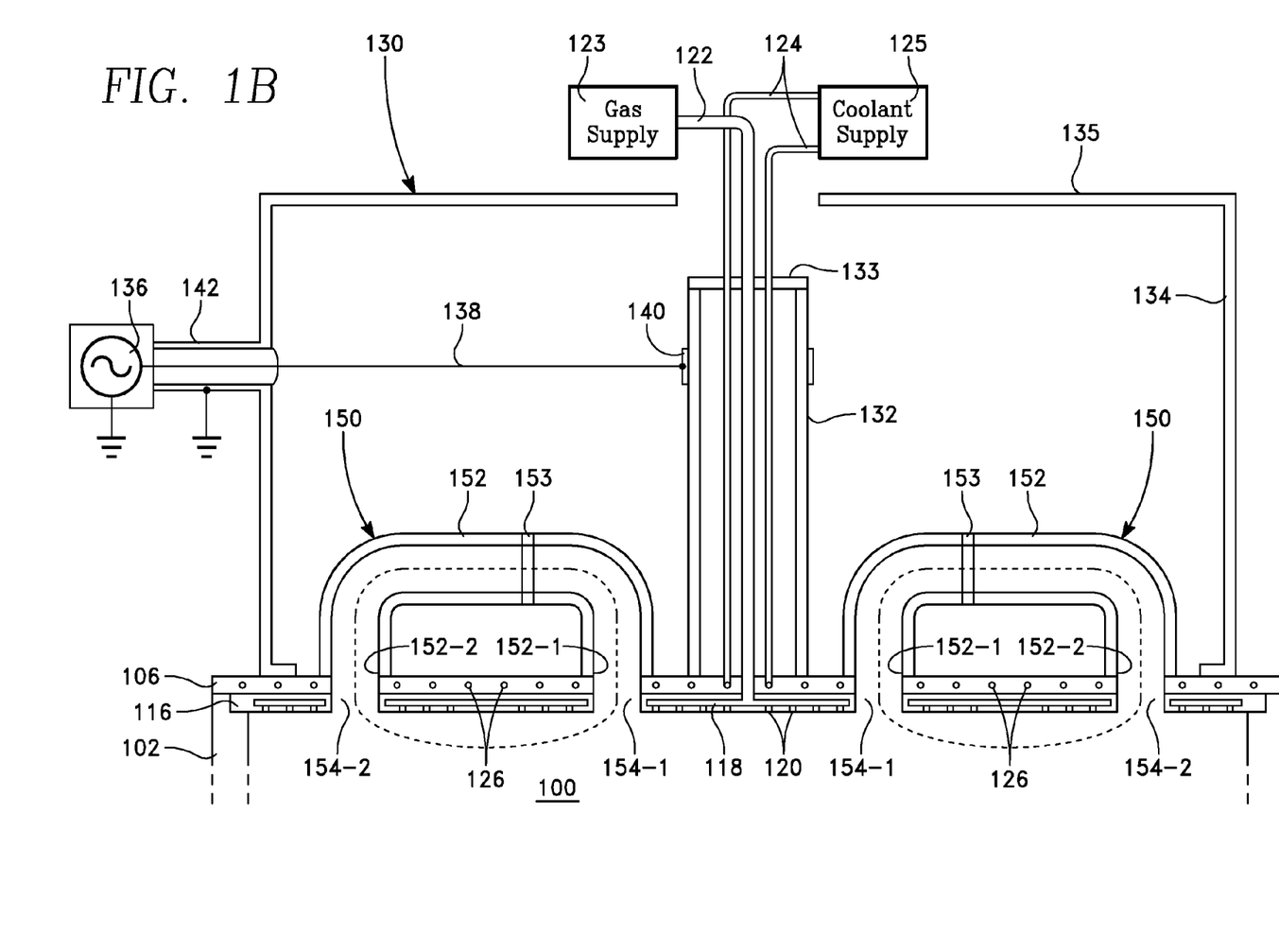
FIG. 1B is an enlarged view of an upper portion of the embodiment of FIG. 1A.

A coaxial resonator 130 formed of conductive structural elements overlies the processing chamber 100. The cover plate 106 serves as a base of the coaxial resonator 130. The coaxial resonator 130 has a hollow driven cylinder 132 surrounded by a hollow return cylinder 134. The hollow driven cylinder 132 and the hollow return cylinder 134 are the coaxial inner and outer conductors, respectively, of the coaxial resonator 130. A disk-shaped inner cap 133 covers the top of the hollow driven cylinder 132. A disk-shaped outer cap 135 covers the top of the hollow return cylinder 134. An RF generator 136 is coupled by a center conductor 138 to the hollow driven cylinder at a tap point 140 on the hollow driven cylinder 132. The RF generator 136 has a frequency and wavelength corresponding to a resonance wavelength of the coaxial resonator 130. The axial location of the tap point 140 may be chosen to match the load impedance to the impedance of the RF generator 136. In this way, the coaxial resonator 130 acts as an impedance match for the RF generator 136, performing an impedance match function. This impedance match function can permit the wavelength of the RF generator 136 to differ from the resonance wavelength while maintaining resonance.

A hollow cylindrical shield 142 surrounds the center conductor 138 and is grounded or connected to the return potential of the RF generator 136. The bottom edges of the hollow driven cylinder 132 and the hollow return cylinder 134 are shorted together by the cover plate 106, forming the shorted end of the coaxial resonator 130 adjacent the processing chamber 100. At the opposite or top end of the coaxial resonator 130, the hollow driven cylinder 132 and the hollow return cylinder 134 are not connected together, and the top end of the coaxial resonator 130 is referred to as the open end. RF current is maximum and RF voltage is minimum at the shorted end, while RF current is minimum and RF voltage is maximum at the open end.

The gas supply conduit 122 extends through the interior of the hollow driven cylinder 132, through the inner cap 133 and through the outer cap 135 to an external gas supply 123. The interior of the hollow driven cylinder 132 may be a field-free region. The pair of coolant supply conduits 124 extend through the interior of the hollow driven cylinder 132, through the inner cap 133 and through the outer cap 135 to an external coolant supply 125.

Figure 1C:
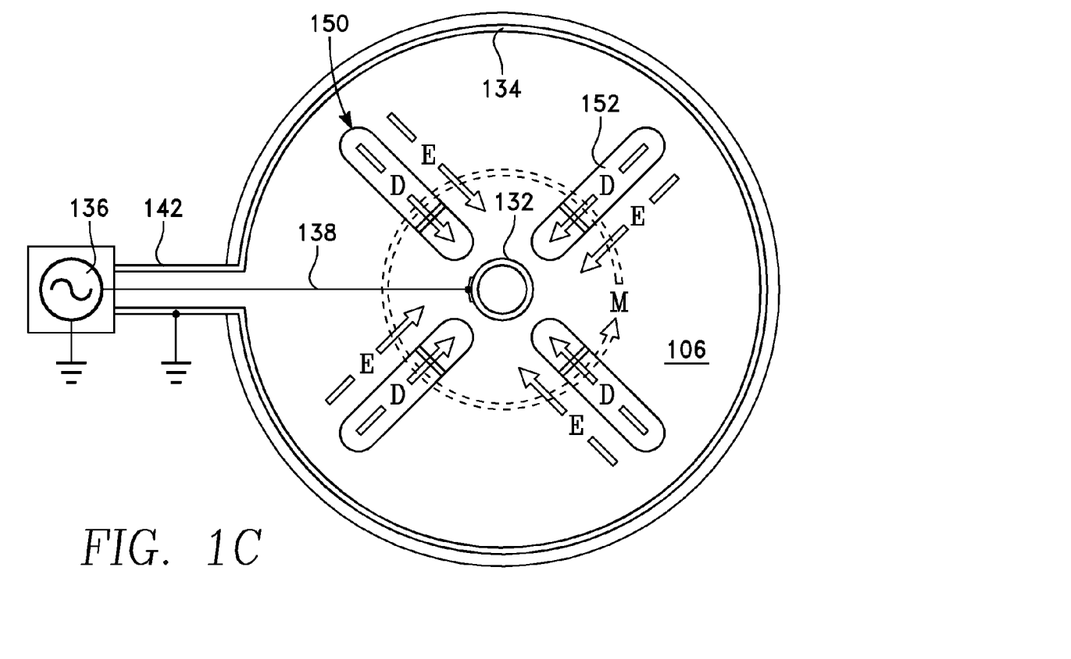
FIG. 1C is a cross-sectional view along lines 1C-1C of FIG. 1A.
Figure 1D:
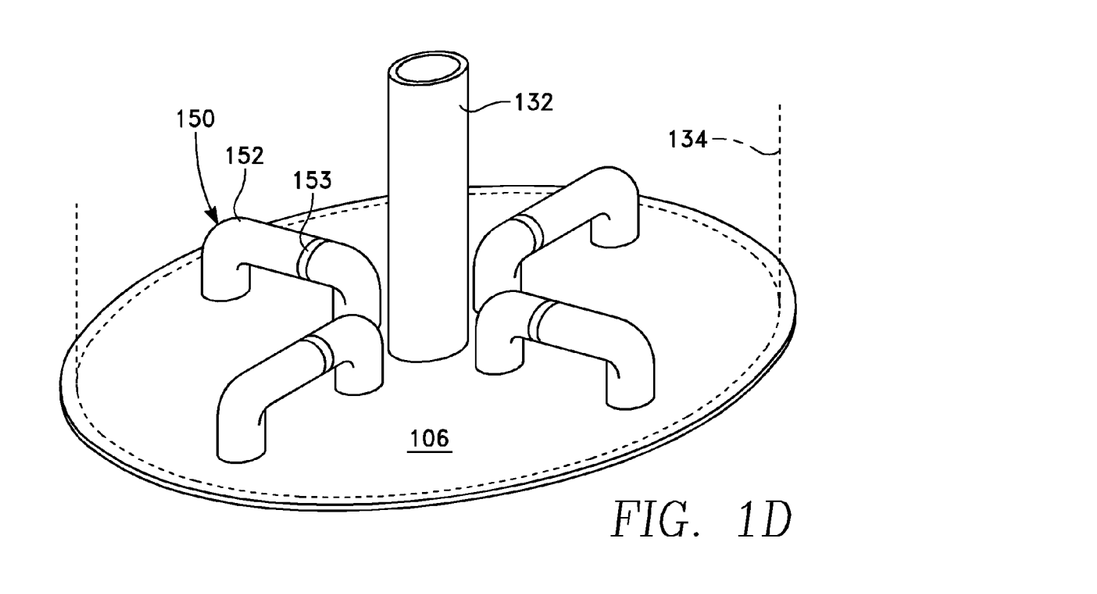
FIG. 1D is an orthographic projection corresponding to FIG. 1C.
Figure 1E:
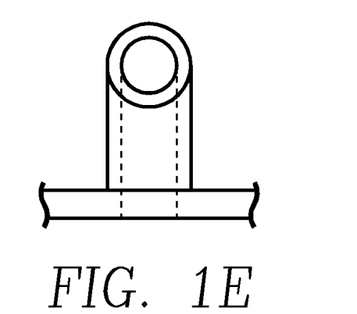
FIGS. 1E-1H are views of toroidal channels of different cross-sectional shapes.
Figure 1F:
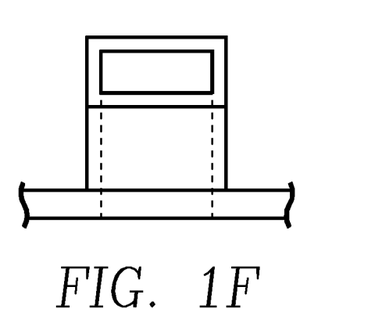
Figure 1G:
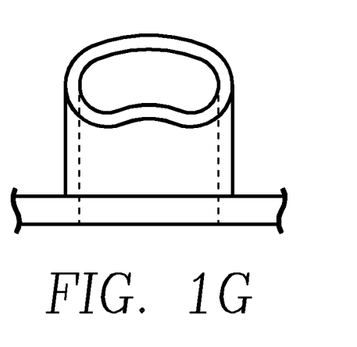
Figure 1H:
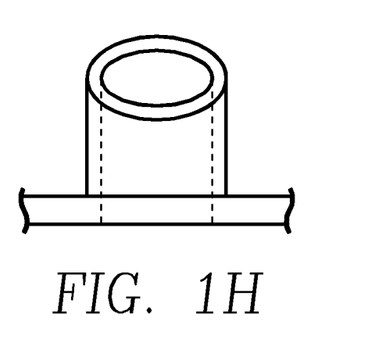

An array of toroidal channels 150 is provided on the top side of the cover plate 106, e.g., the side of the cover plate 106 external of processing chamber 100. Each of the toroidal channels 150 forms a reentrant path. Each one of the toroidal channels 150 includes a reentrant conduit 152 that is external of the processing chamber 100. Each reentrant conduit 152 has a pair of ends 152-1, 152-2 coupled to the interior of the processing chamber 100 through a pair of respective ports 154-1, 154-2 through the cover plate 106. The cross-sectional shape of each of the pair of ports 154-1, 154-2 and the reentrant conduit 152 may be circular (FIG. 1E), rectangular (FIG. 1F), kidney-shaped (FIG. 1G) or elliptical (FIG. 1H). In the embodiment of FIG. 1C, there are four uniformly spaced toroidal channels 150 each defining a reentrant path lying along a predominantly radial direction. However, any suitable number of toroidal channels 150 may be employed. In the embodiment of FIG. 1A, the array of toroidal channels 150 is confined on the cover plate 106 within an annular zone between the driven hollow cylinder 132 and the hollow return cylinder 134.

Each reentrant conduit 152 may include a D.C. break 153, to prevent generation of currents that could otherwise interfere with inductive coupling. The D.C. break 153 may be an annular gap filled with dielectric material.

Each reentrant conduit 152 has a radial path direction D, which is orthogonal to an azimuthal (circular) RF magnetic field M present at the shorted end of the coaxial resonator 130. The azimuthal RF magnetic field M produces a radial RF electric field E that is parallel to the path direction D of each reentrant conduit 152. This azimuthal RF magnetic field is maximum at the coaxial resonator shorted end, e.g., at the cover plate 106, where the reentrant conduits 152 are located, for maximum coupling to RF currents in the array of reentrant conduits 152, producing maximum plasma ion density. Furthermore, the electric field is minimum at the coaxial resonator shorted end, for coupling of minimum voltage to the bulk plasma, to minimize electron temperature. As explained above, minimizing electron temperature and maximizing plasma ion density reduces metal contamination.

Figure 2:
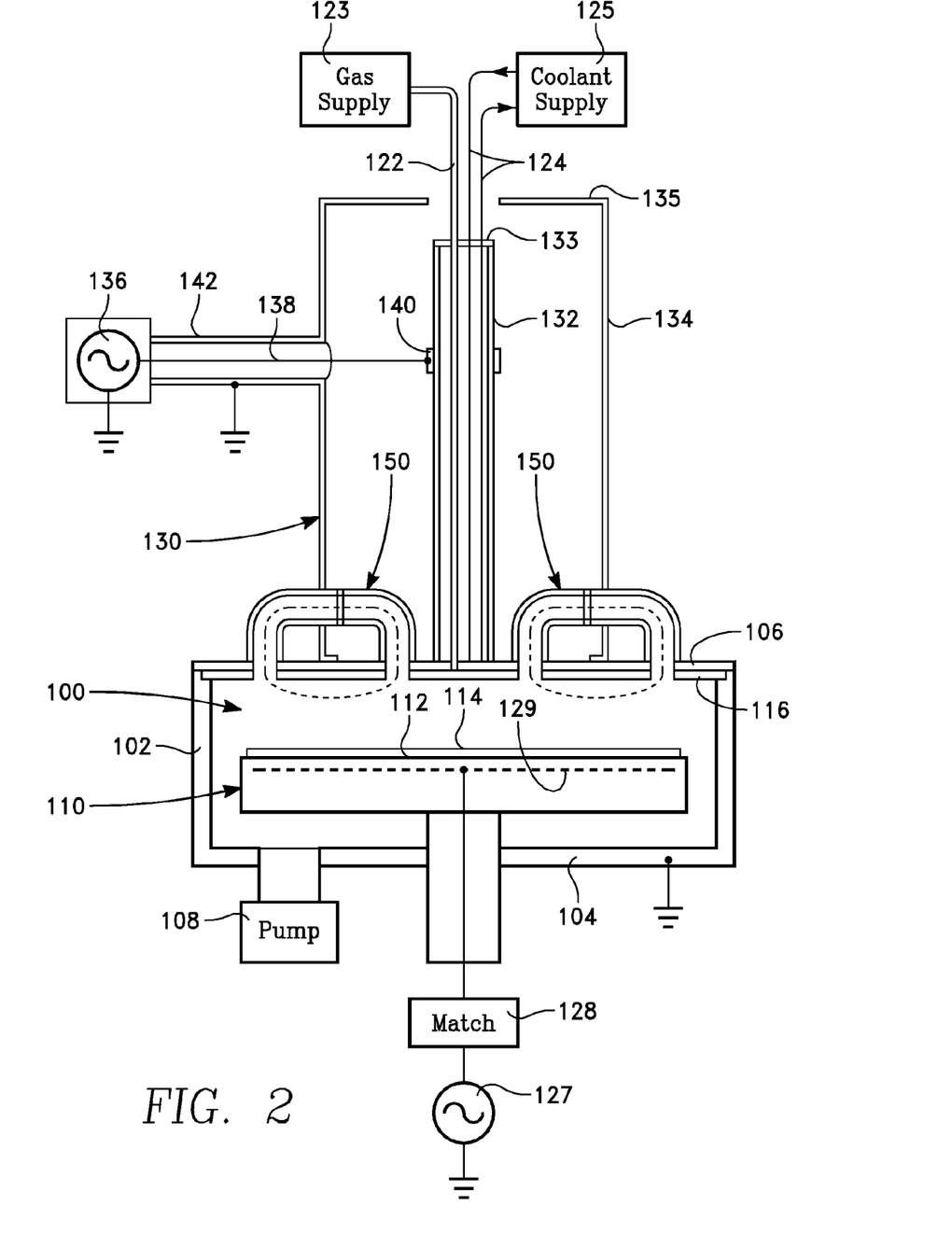
FIG. 2 is an elevational cut-away view of a second embodiment.

FIG. 2 depicts an embodiment in which the toroidal channels 150 extend beyond the diameter of the hollow return cylinder 134. In the embodiment of FIG. 2, the toroidal channels 150 extend through the hollow return cylinder 134. In one implementation of the embodiment of FIG. 2, the toroidal channels 150 may be insulated from the hollow return cylinder 134.

Figure 3:
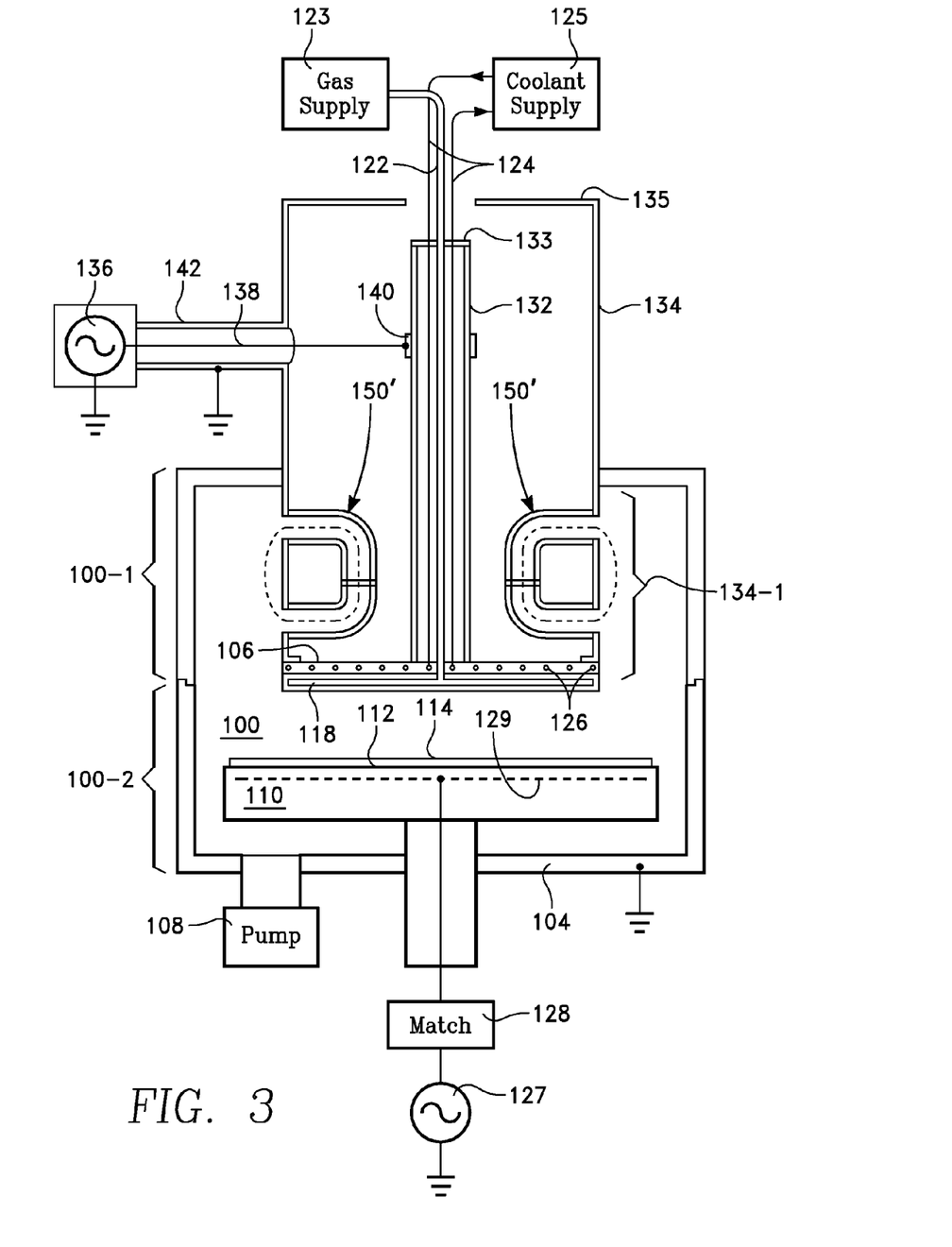
FIG. 3 is an elevational cut-away view of a third embodiment.

FIG. 3 depicts an embodiment in which the circular processing chamber 100 includes an annular upper chamber 100-1 surrounding a lower portion 134-1 of the hollow return cylinder 134, and a cylindrical lower main chamber 100-2. The array of toroidal channels 150 is replaced by an array of radially-facing toroidal channels 150' formed on the lower portion 134-1 of the hollow return cylinder 134. The lower portion 134-1 may be considered as an orthogonal extension or portion of the cover plate 106 or ceiling. The radially-facing toroidal channels 150' are open to the annular upper chamber 100-1.

FIGS. 4A, 4B, 4C and 4D depict an embodiment in which a folded coaxial resonator 230 overlies the processing chamber 100. The folded coaxial resonator 230 includes a hollow inner ground cylinder 231, a hollow outer ground cylinder 234 surrounding the hollow inner ground cylinder 231, and a hollow RF drive cylinder 232 between the inner and outer ground cylinders 231 and 234. The bottom edges of the hollow outer ground cylinder 234 and the hollow RF drive cylinder 232 contact the cover plate 106, forming the shorted end of the folded coaxial resonator 230. The bottom edge 231a of the hollow inner ground cylinder 231 is separated from the cover plate 106 by a gap G1. The top edges of the inner and outer ground cylinders 231, 234 are capped by an annular cover 235 that encloses the annular volume between the inner and outer grounded cylinders 231, 234. The top edge 232a of the hollow RF drive cylinder 232 is below the annular cover 235 and separated therefrom by a gap G2. The sizes of the gaps G1 and G2 may be selected to avoid arcing.

An RF generator 236 is connected to the hollow RF drive cylinder 232 via discrete RF feed conductors 238 connected to two (or more) uniformly spaced points on the top edge 232a of the hollow RF drive cylinder 232. The RF feed conductors 238 pass through openings in the annular cover 235, and are surrounded by tubular shields 239 contacting the annular cover 235.

In the embodiment of FIGS. 4A through 4D, the array of toroidal channels 150 on the cover plate 106 are confined within an annular zone between the hollow outer grounded cylinder 234 and the hollow RF drive cylinder 232. Each of the toroidal channels 150 in the embodiment of FIGS. 4A through 4D may be of the structure described above with reference to FIGS. 1A-1D, and may have any of the cross-sectional shapes of FIGS. 1E-1H.

Figure 4A:
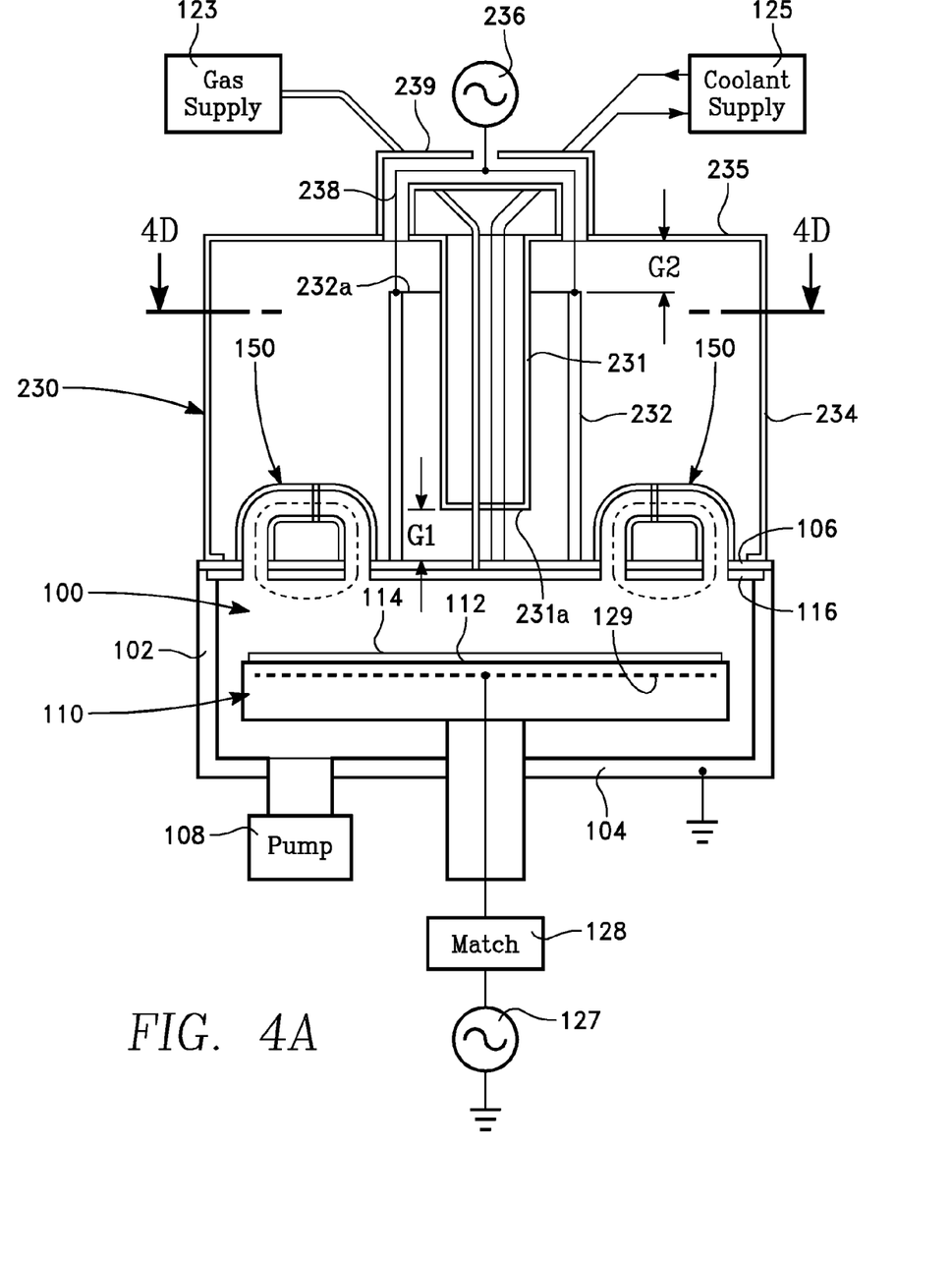
FIG. 4A is an elevational cut-away view of a fourth embodiment.
Figure 4B:
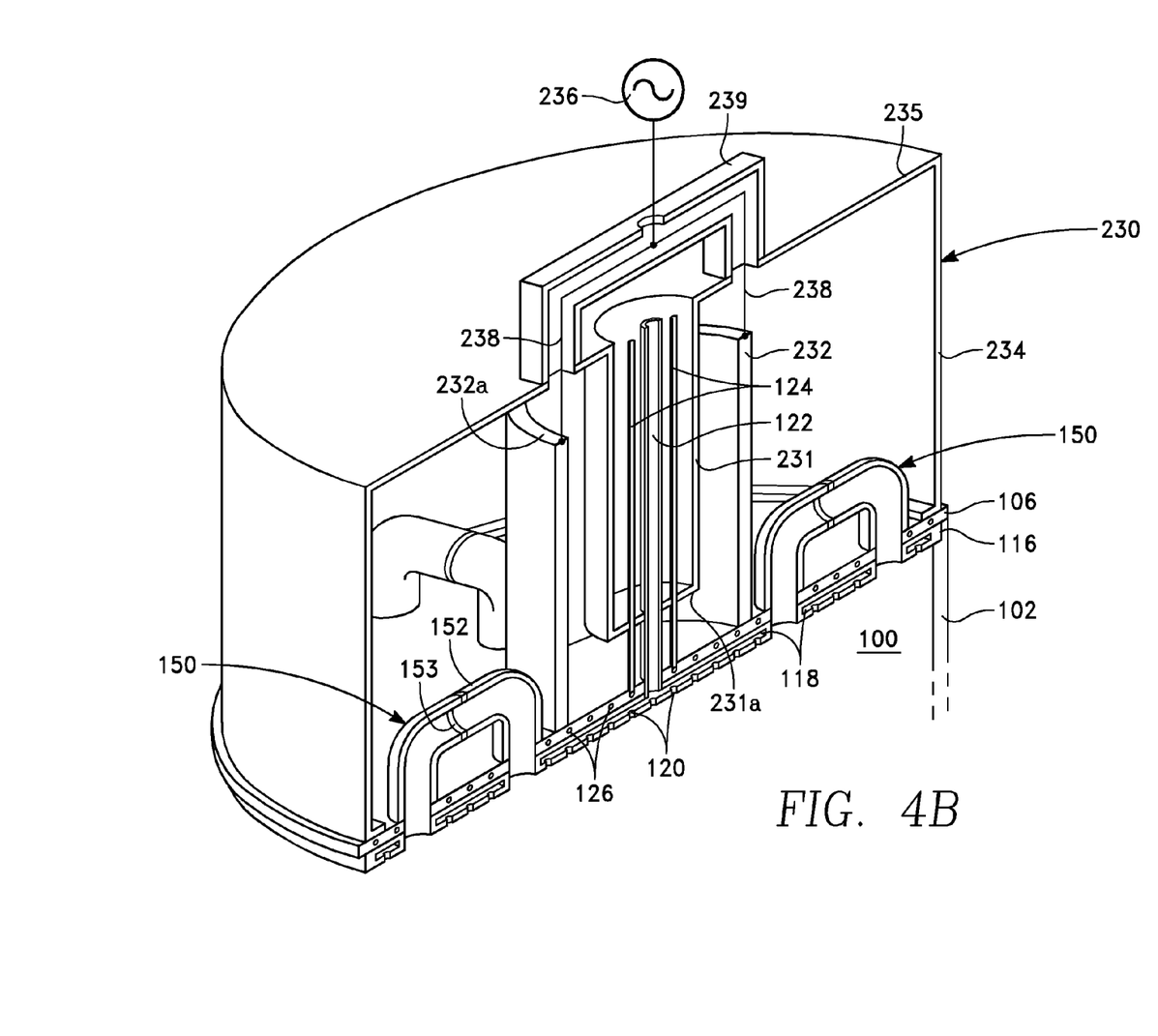
FIG. 4B is an orthographic projection corresponding to FIG. 4A.
Figure 4C:
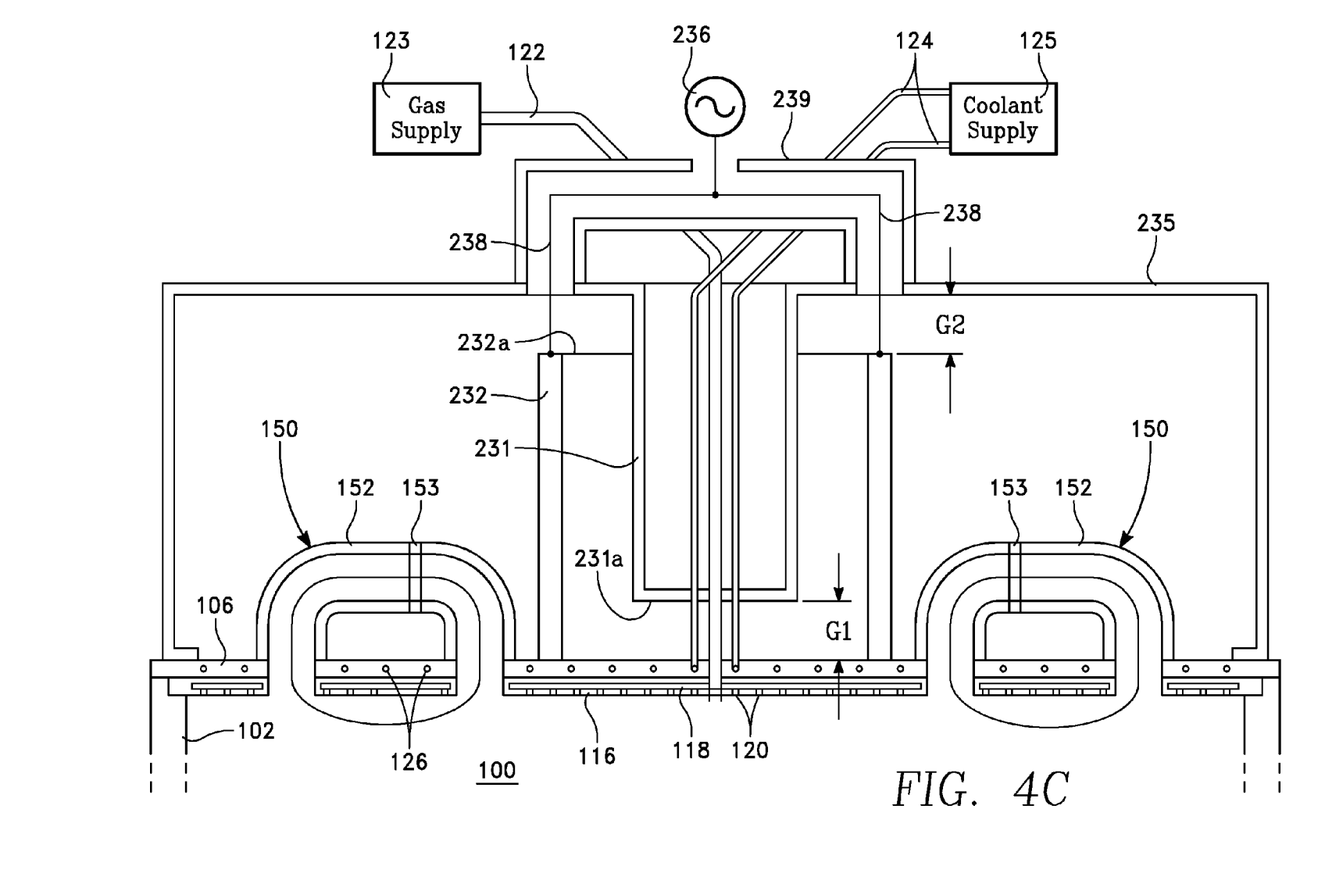
FIG. 4C is an enlarged view of an upper portion of the embodiment of FIG. 4A.
Figure 4D:
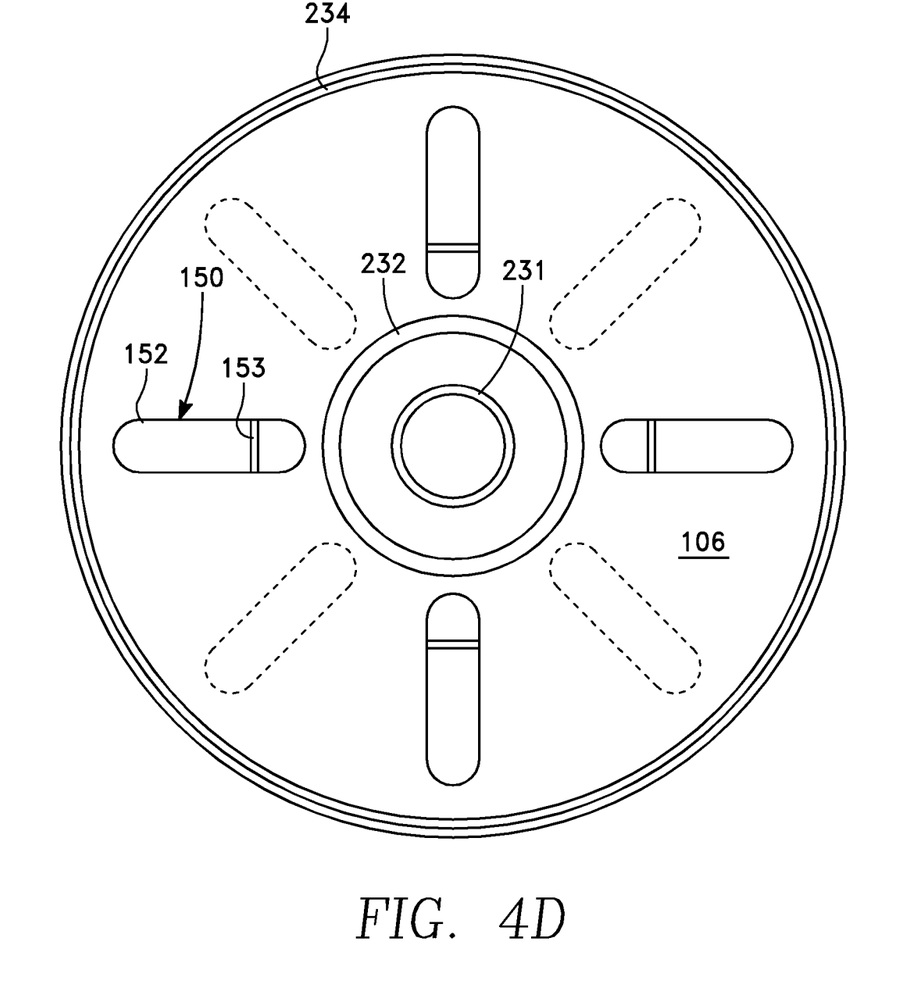
FIG. 4D is a cross-sectional view along lines 4D-4D of FIG. 4A.

As depicted in FIG. 4C, the gas supply conduit 122 and the coolant supply conduits 124 extend upwardly from the cover plate 106 through the interior of the hollow inner grounded cylinder 231 to the gas supply 123 and the coolant supply 125, respectively. The interior of the hollow inner grounded cylinder 231 may be a field-free region. FIG. 4D depicts an embodiment employing four toroidal channels (solid line), which optionally may be supplemented by four additional toroidal channels (dashed line). Any suitable number of toroidal channels may be employed.

Figure 5A:
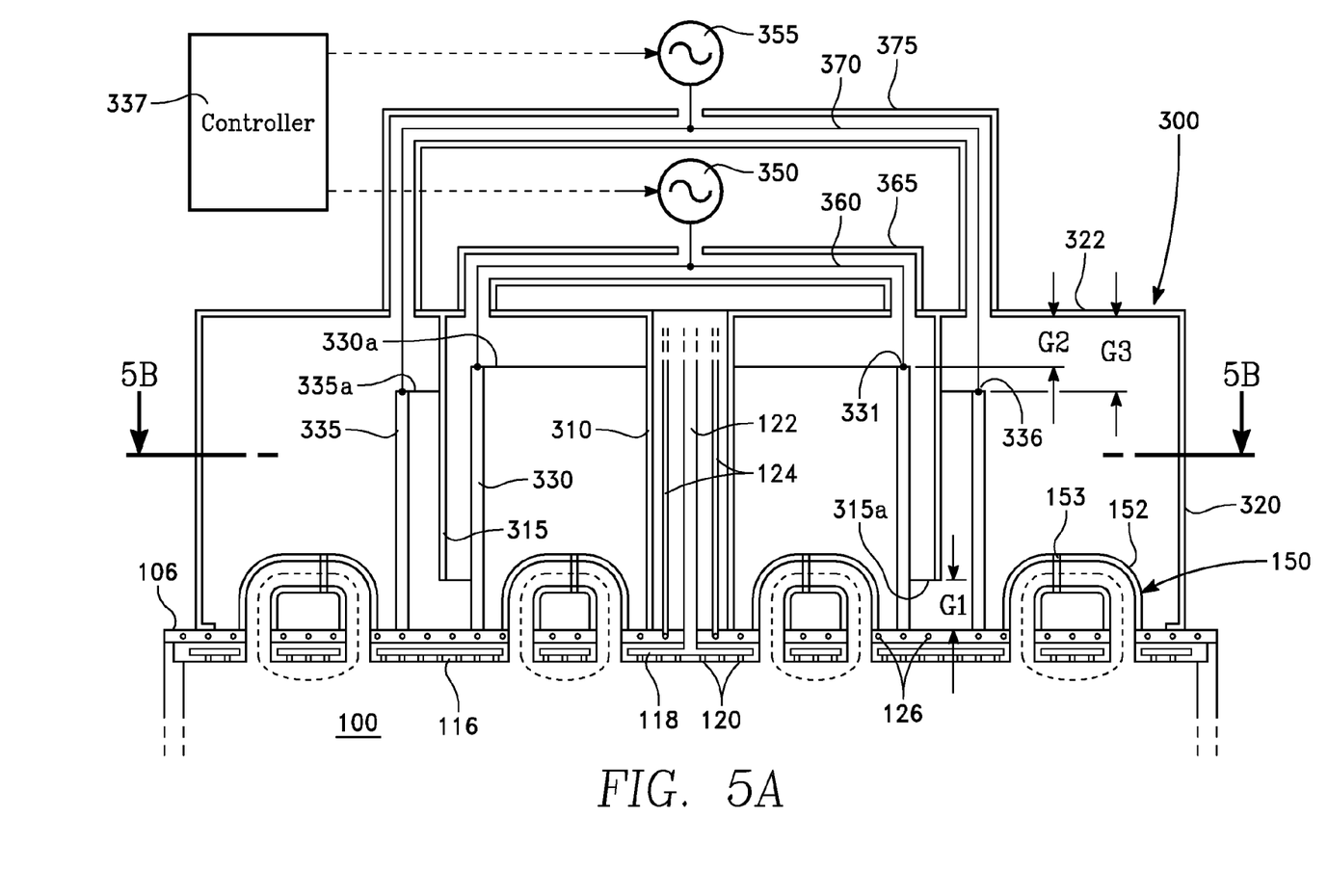
FIG. 5A is an elevational cut-away view of a fifth embodiment.
Figure 5B:
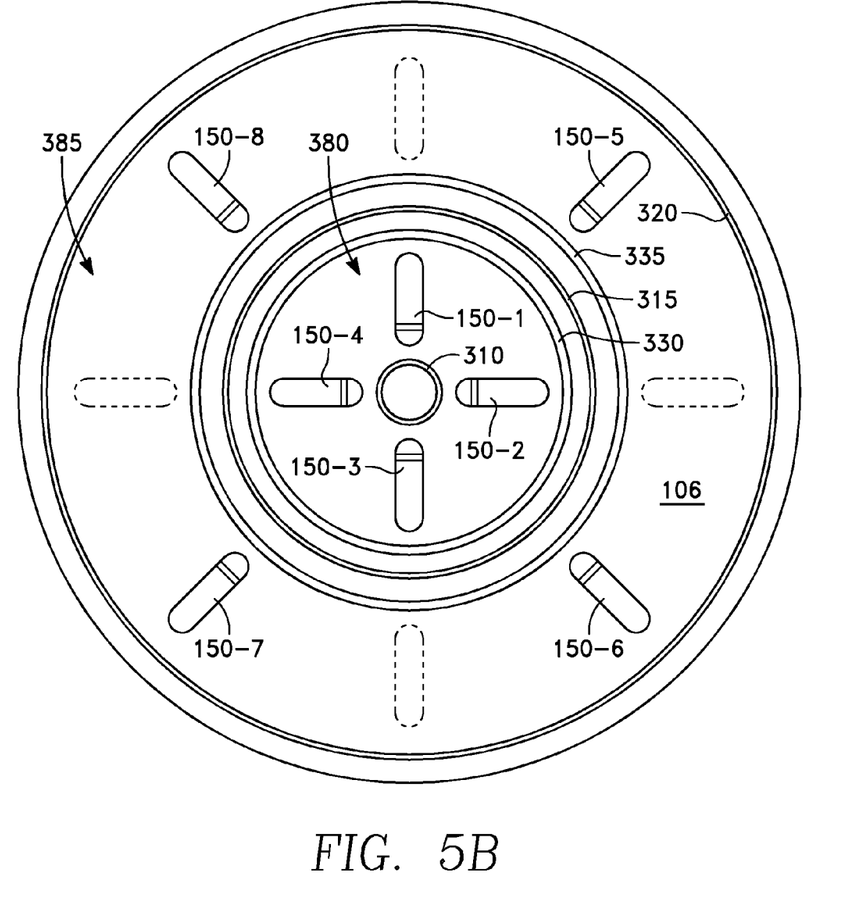
FIG. 5B is a cross-sectional view along lines 5B-5B of FIG. 5A.

FIGS. 5A and 5B depict an embodiment with a multiple zone folded coaxial resonator 300 overlying the cover plate 106. The multiple zone coaxial resonator 300 includes an inner return cylinder 310, an intermediate return cylinder 315, an outer return cylinder 320 and a disk-shaped cap 322. The inner return cylinder 310 and outer return cylinder 320 extend from the disk-shaped cap 322 to the cover plate 106. The intermediate return cylinder 315 extends downwardly from the cap 322 and has a bottom edge 315a separated from the cover plate 106 by a gap G1. An inner zone driven cylinder 330 is surrounded by the intermediate return cylinder 315. The inner zone driven cylinder 330 has a top edge 330a separated from the disk-shaped cap 322 by a gap G2. An outer zone driven cylinder 335 surrounds the intermediate return cylinder 315. The outer zone driven cylinder 335 has a top edge 335a separated from the disk-shaped cap 322 by a gap G3. In the illustrated embodiment, the gaps G2 and G3 are of different sizes for ease of illustration, although in general they may be of the same size.

The inner zone driven cylinder 330 is coupled at its top edge 330a to an inner zone RF generator 350 through RF feed conductors 360 surrounded by shielding 365 contacting the disk-shaped cap 322. The outer zone driven cylinder 335 is coupled at its top edge to an outer zone RF generator 355 through RF feed conductors 370 surrounded by shielding 375 contacting the disk-shaped cap 322. A controller 337 governs the ratio between the RF output power levels of the inner zone RF generator 350 and the outer zone RF generator 355. The controller 337 controls the radial distribution of plasma ion density among the inner and outer zones of the chamber 100 coinciding with the inner zone driven cylinder 330 and the outer zone driven cylinder 335.

As depicted in FIGS. 5A and 5B, the RF feed conductor 360 contacts the top edge 330a at plural uniformly spaced points 331, while the RF feed conductor 370 contacts the top edge 335a at plural uniformly spaced points 336.

As shown in FIG. 5B, an inner annular zone 380 of the cover plate 106 supports toroidal channels 150-1 through 150-4, while an outer annular zone 385 of the cover plate 106 supports toroidal channels 150-5 through 150-8. In the illustrated embodiment there are four uniformly spaced toroidal channels in each zone 380, 385. Any other suitable number of toroidal channels may be provided in each zone. For example, FIG. 5B depicts in dashed line the optional inclusion of four additional toroidal channels in the outer zone 385. Each of the toroidal channels 150-1 through 150-8 may be of the structure described above with reference to FIGS. 1A-1D. In the illustrated embodiment, the inner zone 380 lies between the inner return cylinder 310 and the intermediate return cylinder 315, while the outer zone 385 lies between the outer return cylinder 320 and the intermediate return cylinder 315.

As in the embodiment of FIGS. 1A-1D, in FIG. 5A a gas injection plate 116 on the bottom surface of the cover plate 106 includes an internal gas manifold 118 having an array of gas injection orifices 120 facing the workpiece support surface 112. A gas supply conduit 122 coupled to the internal gas manifold 118 extends upwardly from the gas injection plate 116. A pair of coolant circulation conduits 124 extend to internal coolant circulation passages 126 within the cover plate 106. The gas supply conduit 122 extends through the interior of the inner return cylinder 310 to an external gas supply. The interior of the inner return cylinder 310 may be a field-free region. A pair of coolant circulation conduits 124 extend through the interior of the inner return cylinder 310 from an external coolant supply, to coolant passages 126 within the cover plate 106.

Embodiments may be employed for sequential processing, in which the gas distribution plate 118 of FIG. 1 is divided into four separate sections (e.g., quadrants) corresponding to the four toroidal channels 150 of FIG. 1. Each quadrant of the gas distribution plate is supplied with a different process gas, so that each toroidal channel 150 provides a plasma of different species. The workpiece support surface 112 may be rotatable, so that different sections (e.g., quadrants) of the workpiece are exposed to the different plasmas at different times. While such sequential processing is described here with reference to an equal number of toroidal channels and sections of the gas distribution plate 118 in which the number is four, any other suitable number of toroidal channels and gas distribution plate sections may be employed.

While the foregoing embodiments have been described with reference to a coaxial resonator (130, 230 or 300) having an effective length corresponding to a wavelength at the RF power generator frequency, it is not required that the generator wavelength exactly match the coaxial resonator length. If the RF power generator wavelength differs from the coaxial resonator length, then an impedance matching function performed by the coaxial resonator 130, 230 or 300 compensates for the difference.

Each of the embodiments described can provide one or more of the following characteristics: ability to generate a high density plasma with minimum capacitive effects, which minimizes plasma ion energy at metal surfaces adjacent the plasma sheath; a grounded conductive chamber ceiling, to which process gases and coolant flow may be provided through a field-free region, and which provides a uniform RF ground reference for an optional RF bias power generator; and, immunity from influence by chamber grounds, because the plasma current closes a current loop on its own.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a processing chamber comprising a ceiling and a workpiece support;
   a resonator having an axis of symmetry and comprising:
   inner and outer return cylinders and an intermediate return cylinder between said inner and outer return cylinders,
   inner and outer RF-driven cylinders adjacent inner and outer surfaces, respectively, of said intermediate return cylinder,
   said inner and outer return cylinders and said inner and outer RF-driven cylinders contacting said ceiling; and
   inner and outer pluralities of reentrant conduits on a side of said ceiling external of said processing chamber, said inner and outer pluralities of reentrant conduits disposed, respectively, in inner and outer concentric zones of said ceiling.

2. The plasma reactor of claim 1 wherein each of said plural reentrant conduits extends in a radial direction.

3. The plasma reactor of claim 1 further comprising first and second RF power generators coupled to said inner and outer RF-driven cylinders, respectively, and a controller connected to said first and second RF power generators.

4. The plasma reactor of claim 2 wherein said ceiling comprises, for each respective reentrant conduit of said inner and outer pluralities of reentrant conduits, a pair of ports extending through said ceiling and coupled to opposite ends of the respective reentrant conduit.

5. The plasma reactor of claim 1 wherein each of said plural reentrant conduits comprises a conductive main portion and an insulating ring-shaped break.

6. The plasma reactor of claim 1 wherein:
said ceiling comprises:
an internal gas manifold; and
gas injection orifices coupled to said gas manifold;
said plasma reactor further comprises:
a process gas supply; and
a gas supply conduit coupled to said internal manifold and extending axially from said internal manifold and through an interior volume of said inner return cylinder to said process gas supply.

7. The plasma reactor of claim 1 further comprising a cap covering and contacting top edges of said inner, outer and intermediate return cylinders.

8. The plasma reactor of claim 7 wherein said inner and outer RF-driven cylinders are terminated at respective heights below said cap defining respective gaps between said inner and outer RF-driven cylinders and said cap.

9. The plasma reactor of claim 8 wherein said intermediate return cylinder is terminated at a height above said ceiling defining a separation between said intermediate return cylinder and said ceiling.

10. The plasma reactor of claim 1 further comprising:
a first plurality of legs connected between said first RF power generator and respective first points on said inner RF-driven cylinder; and
a second plurality of legs connected between said second RF power generator and respective second points on said outer RF-driven cylinder.

11. The plasma reactor of claim 10 wherein said respective first points are located on a top edge of said inner RF-driven cylinder and said respective second points are located on a top edge of said outer RF-driven cylinder.

12. The plasma reactor of claim 11 further comprising a first shield enveloping a portion of each of said first plurality of legs and a second shield enveloping a portion of each of said second plurality of legs.

13. The plasma reactor of claim 1 wherein said ceiling contacts respective bottom edges of said inner and outer return cylinders and respective bottom edges of said inner and outer RF-driven cylinders.

14. The plasma reactor of claim 1 wherein said inner and outer concentric zones of said ceiling are divided at a circular border corresponding to said intermediate return cylinder.

15. A plasma source for generating a plasma in a chamber, comprising:
a conductive plate covering said chamber;
a resonator having an axis of symmetry and comprising (a) inner and outer return cylinders and an intermediate return cylinder between said inner and outer return cylinders, (b) inner and outer RF-driven cylinders adjacent inner and outer surfaces, respectively, of said intermediate return cylinder, (c) said inner and outer return cylinders and said inner and outer RF-driven cylinders comprising bottom edges contacting said conductive plate; and
plural reentrant conduits on said conductive plate, wherein each of said plural reentrant conduits encloses a path extending in a radial direction.

16. The plasma source of claim 15 wherein said plural reentrant conduits comprise inner and outer pluralities of reentrant conduits disposed, respectively, in inner and outer concentric zones of said conductive plate.

17. The plasma source of claim 16 wherein each of said plural reentrant conduits extends in a radial direction.

18. The plasma source of claim 15 further comprising first and second RF power generators coupled to said inner and outer RF-driven cylinders, respectively, and a controller connected to said first and second RF power generators.

19. The plasma source of claim 15 wherein each of said plural reentrant conduits comprises a conductive main portion and an insulating ring-shaped break.

20. A plasma source for producing plasma in a chamber, comprising:
a plate overlying said chamber;
plural radially extending reentrant conduits on said plate;
a resonator comprising a shorted end and an open end and plural cylinders extending axially between said shorted and open ends, said shorted end facing and contacting said plate, said resonator further comprising inner and outer zones comprising, respectively, said plural cylinders comprising inner and outer RF-driven cylinders and a ground cylinder between said inner and outer RF-driven cylinders; and
first and second RF power generators coupled to said inner and outer RF-driven cylinders.

\* \* \* \* \*